United States Patent [19]
Tanaka et al.

[11] Patent Number: 5,147,683
[45] Date of Patent: Sep. 15, 1992

[54] PROCESS FOR PREPARING A THIN FILM ELECTROLUMINESCENT DEVICE

[75] Inventors: Koichi Tanaka, Nara; Akiyoshi Mikami, Yamatotakada; Kouji Taniguchi, Nara; Katsushi Okibayashi, Sakurai; Kousuke Terada; Takuo Yamashita, both of Tenri; Takashi Ogura, Nara; Hiroaki Nakaya, Tenri; Masaru Yoshida; Shigeo Nakajima, both of Nara, all of Japan

[73] Assignee: Sharp Kabushiki Kaisha, Osaka, Japan

[21] Appl. No.: 638,841

[22] Filed: Jan. 8, 1991

[30] Foreign Application Priority Data

Jan. 9, 1990 [JP] Japan ......................... 2-3190

[51] Int. Cl.⁵ ............................................. B05D 3/06
[52] U.S. Cl. ........................... 427/69; 427/253; 427/255.2
[58] Field of Search ............... 427/69, 253, 255.2

Primary Examiner—Bernard Pianalto
Attorney, Agent, or Firm—Birch, Stewart, Kolasch & Birch

[57] ABSTRACT

Disclosed is an improvement of the chemical vapor deposition (CVD) process for preparing an electroluminescent device having a large area and a large size. The process includes forming a luminescent layer on a substrate by a reduced-pressure chemical vapor deposition method wherein a source material gas is introduced into a reaction chamber. The reaction chamber includes a screening means which screens the source material gas flow in the chamber to form a first area in which the gas is flowing and a second area in which the gas substantially does not flow. The screening means has apertures for connecting the first area and second area. the substrate is placed in the second area, to which the source material is supplied by means of gas diffusion.

6 Claims, 6 Drawing Sheets

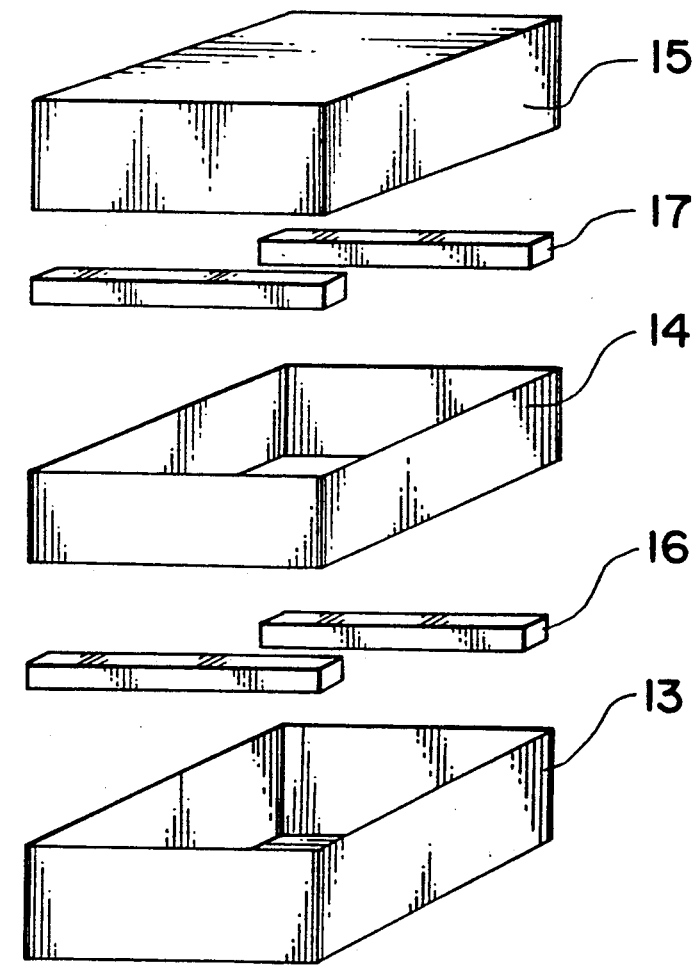

Fig. 3a
<Side slit type>
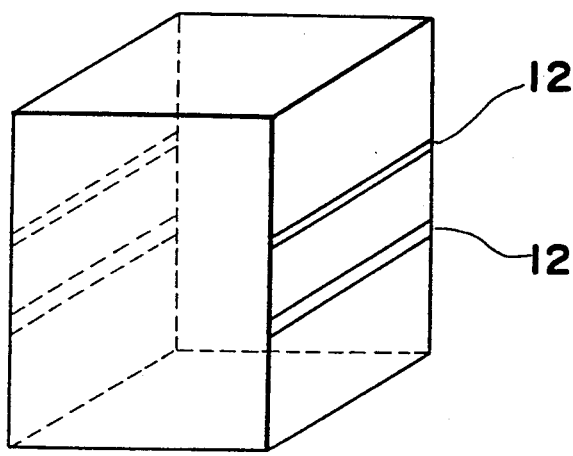
Fig.3(b)         Fig. 3 (c)
<Side hole type>    <Upper and lower face slit type>
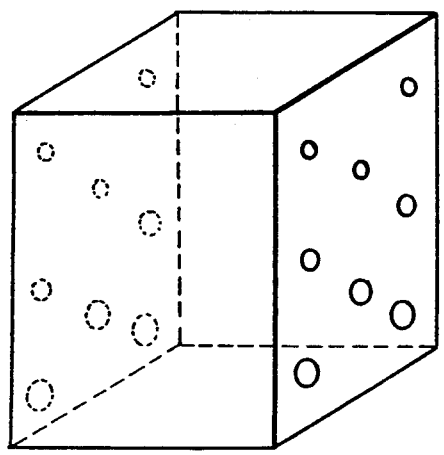 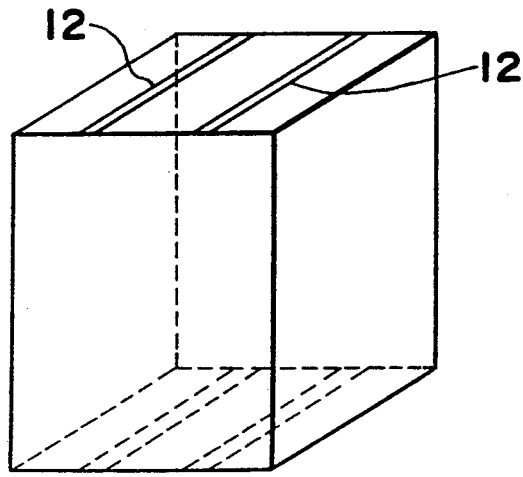

Fig. 6a
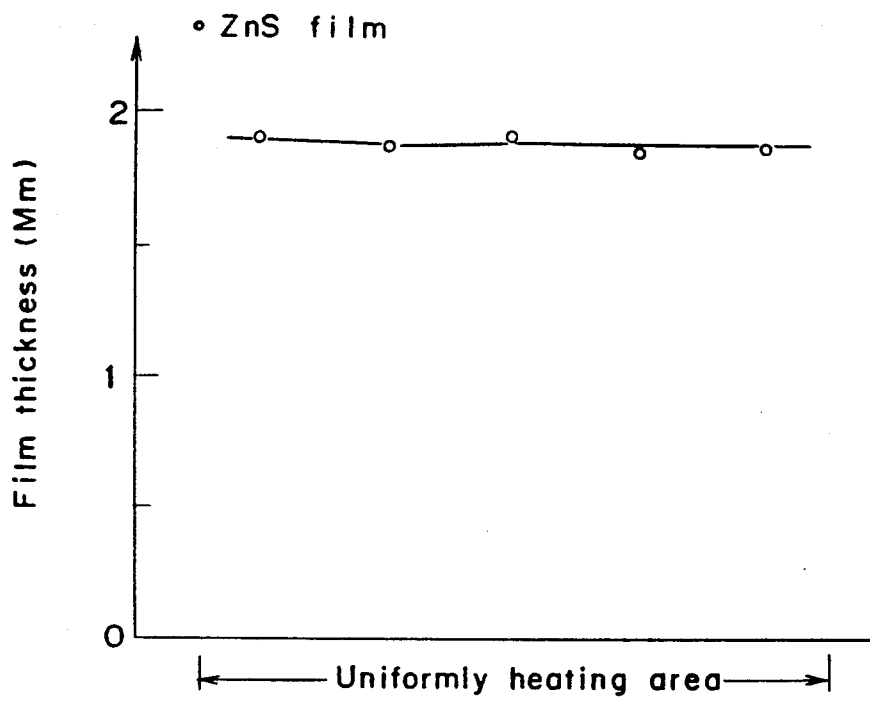
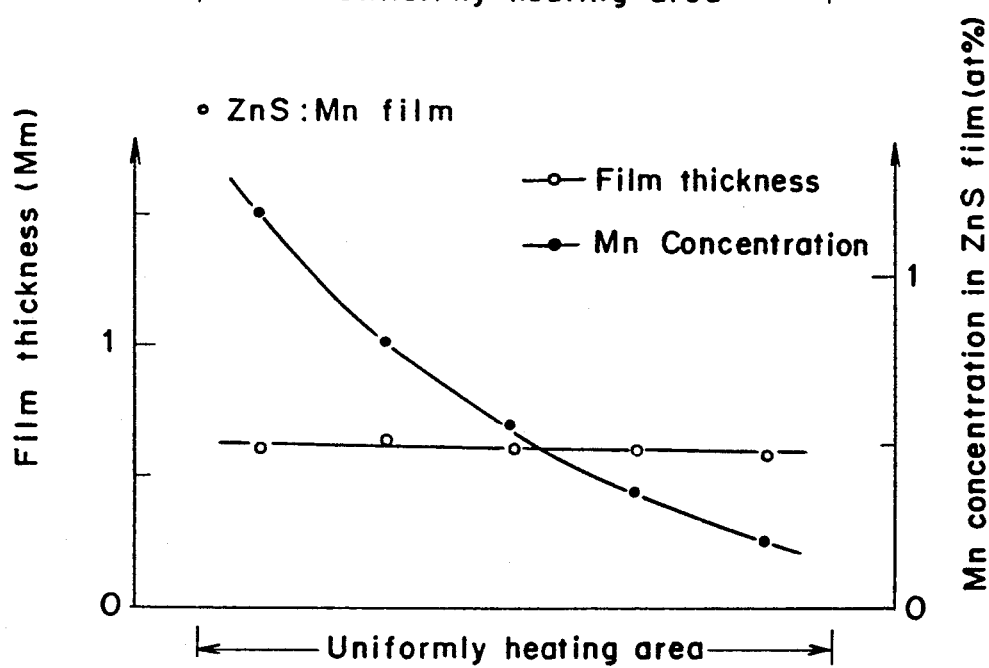
Fig. 6b

PROCESS FOR PREPARING A THIN FILM ELECTROLUMINESCENT DEVICE

FIELD OF THE INVENTION

The present invention relates to a process for preparing a thin film electroluminescent device.

BACKGROUND OF THE INVENTION

There have been proposed many plain display devices which employ a liquid crystal, plasma or electroluminescent thin film. Among them, the thin film electroluminescent devices are mainly used for displays of office automation apparatus or testing apparatus, because the device is light and thin. Recently, the devices which have a display capacity of 1,152×900 dots and a gradation function of 16 steps have been commercially available. Thus, as increasing informations to be displayed, the thin film electroluminescent devices having larger area and larger size are desired.

The electroluminescent devices which have been practically used have an electroluminescent layer of ZnS:Mn which is generally produced by an electron beam deposition method. However, for producing the devices having such larger area and larger size, the electron beam evaporation method encounters some problems. For example, a gas exhausting system is employed in the method, but it is required that its exhausting capacity be increased with the increase of the size of the substrate. It is however difficult to make such exhausting system having a large exhausting capacity. It is also reported in Applied Physics 51, 821 (1982) that a temperature of the substrate changes the Mn concentration or the quality of the ZnS:Mn film prepared by the electron beam deposition method. However, it is very difficult to keep the temperature of the substrate throughout the large surface area.

A chemical vapor deposition (CVD) method is also known to the art as a method forming a uniform thin film on a large area and is popular in the semiconductor industry. FIG. 5 (a) schematically shows an apparatus for the CVD method and FIG. 5 (b) schematically shows a substrate holder. In the apparatus, a source material gas is introduced from introducing tubes 1, 2 and 3 which are arranged at one end of a reaction tube 4. The reaction tube 4 is exhausted by an exhausting system through the other end to keep the reaction tube 4 in vacuo. The reaction tube 4 is surrounded with furnaces 5 which control a temperature of substrates 8. The substrates 8 are held by a holder 7 in a uniform by heating area 6 in which a certain temperature is kept fixed. If the source material gas is composed of SiH$_4$ and NH$_3$, an Si$_3$N$_4$ film which is employed as an insulation film for LSI is formed by the following reaction:

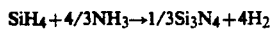

$$SiH_4 + 4/3NH_3 \rightarrow 1/3Si_3N_4 + 4H_2$$

In the case where the CVD apparatus is operated in an industrial scale, many substrates are put in the uniformly heating area 6, but the non-uniformity of the deposition film thickness generally occurs because of two reasons. One reason is the diffusion constant of the source material gas and the other reason is the concentration difference of the source material gas in the flowing direction in which the source material is consumed more at earlier contacting place with the substrate. The former reason results in the non-uniformity of the deposited film thickness throughout the surface and the later reason results in the reduction of film thickness along the source gas stream. The former problem, however, can be removed by reducing an inside pressure of the reaction tube and increasing the diffusion constant, and the later can be removed by increasing a feeding rate of the source material in terms of the source material gas flow in comparison with the consuming rate of the source material so as to almost unify the source material gas concentration in the flowing direction.

The CVD method has been applied little for forming a luminescent layer of the thin film electroluminescent device, but the present inventors tried to study it for forming the luminescent layer larger around the thin film electroluminescent devices and for producing them in an industrial scale. The CVD apparatus as shown in FIG. 5 was employed for forming a ZnS film. ZnS powder was heated at 900° to 1,000° C. and the vapor was sent to the reaction tube 4 with H$_2$ gas. The glass substrate was employed and its temperature was set 450° to 550° C. An inside pressure of the reaction tube 4 was kept $10^{-2}$ torr and the deposition was conducted for 60 minutes. The obtained ZnS film was a polycrystalline film having zincblende structure and oriented to the (111) direction. FIG. 6 (a) is a film thickness distribution in the uniformly heating area, which clearly shows the uniformity of the film thickness.

Next, a ZnS:Mn film was prepared using the same apparatus. The deposition conditions were the same, provided that an Mn gas source was fed. The Mn gas was introduced in the form of MnCl$_2$ gas prepared by heating Mn at 800° to 900° C. and then mixing with HCl gas to react as follow;

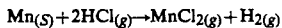

$$Mn_{(S)} + 2HCl_{(g)} \rightarrow MnCl_{2(g)} + H_{2(g)}$$

FIG. 6 (b) is a graph which indicates an Mn concentration and a ZnS:Mn film thickness distribution in the uniformly heating area. The results shows that the film thickness reduced to ⅓, but has good uniformity. The Mn concentration is widely changed from higher at the upper stream to lower at lower stream. The ZnS:Mn film has a wultzite structure. It is believed that the reduction of the film thickness is caused by etching the ZnS film by means of HCl gas which occurs by the addition of MnCl$_2$ gas.

As is apparent from the above results, the ZnS:Mn film obtained by the reduced-pressure CVD method has a drawback of the non-uniformity of the Mn concentration. The above results are obtained by a horizontal furnace, but if it is conducted by a perpendicular furnace, the same non-uniformity of Mn concentration would occur within the substrate.

It is believed that the non-uniformity of Mn concentration is caused by the following reason: Since a vapor pressure of MnCl$_2$ is low in the substrate temperature area, the deposition of Mn occurs easily, so that the Mn in the source material gas is consumed more at the upper stream and the Mn concentration reduces at the lower stream. The non-uniformity may be improved by increasing an flow rate of the source material gas, but the source material gas is sufficiently fed in view of the uniformity of the ZnS:Mn film thickness. If the flow rate of the source material gas is increased, a conversion rate of the source material to the deposited film is also reduced and a production cost becomes expensive. Also, the increase of the flow raises an inside pressure of the reaction tube, which often gives rise to an non-uniformity caused by the increase of diffusion constant and adversely affects on the uniformity of the ZnS film which is a host material of the ZnS:Mn film.

The above mentioned problems are common with the luminescent center of the thin film electroluminescent film device produced by the reduced-pressure CVD method, i.e. Tb in ZnS:Tb, Eu in Cas:Eu film and Ce in SrS:Ce.

SUMMARY OF THE INVENTION

The present invention provides an improvement of the chemical vapor deposition (CVD) process for preparing an electroluminescent device having a large area and a large size. The process of the present invention comprises forming a luminescent layer on a substrate by a reduced-pressure chemical vapor deposition method wherein a source material gas is introduced into a reaction chamber and an improvement being present in that;

the reaction chamber includes a screening means which screens the source material gas flow in the chamber to form a first area in which the gas is flowing and a second area in which the gas substantially does not flow, the screening means has apertures for connecting the first area and second area, the substrate is placed in the second area, to which the source material is supplied by means of gas diffusion.

FIG. 1 schematically shows an apparatus employed in this Example.

FIG. 2 schematically shows a container 11 having slits 12.

FIG. 3 (a), (b) and (c) show schematical views of other embodiments of the container.

FIG. 4 shows a graph of L-V (luminance-applied voltage) characteristics with respect to the above obtained EL device and another conventional EL device which was prepared by the electron beam deposition.

FIG. 5 (a) schematically shows an apparatus for chemical vapor deposition (CVD) and FIG. 5 (b) schematically shows a substrate holder.

FIG. 6 (a) is a film thickness distribution in the uniformly heating area, FIG. 6 (b) is a graph which indicates an Mn concentration and a uniform ZnS:Mn film thickness distribution in the heating area.

DETAILED DESCRIPTION OF THE INVENTION

The screening mean of the present present invention is not limited as long as the flow of the source material gas is screened in the substrates area. It can be formed by surrounding the substrate area with boards. It also can be a container box having some apertures and put on the substrates area.

The apertures in the screening mean are formed such that the screening effect of the source material gas flow is not lowered. A shape and position of the apertures can be determined in view of a concentration of the luminescent center atom in the source material gas. For example, the shape includes holes, slits or mesh. It is preferred that the shape and position of the apertures are controlled such that at the higher concentration area the apertures are smaller and at the lower concentration area they are larger, whereby the amount of the luminescent center atoms diffused through the apertures is almost equal at any position. The apertures and screening mean are designed such that an amount of the luminescent center atom is common around all the substrates.

In the present invention, the substrates are placed in the second area in which the source material gas flow is little present. In this area, the feed of the source material gas is mainly conducted by diffusion through the apertures and little by gas stream. Accordingly, the luminescent film is made from the source material fed by the diffusion, so that the concentration of the luminescent center atom can be unified.

PREFERRED EMBODIMENT OF THE INVENTION

The present invention is illustrated by the following Examples which, however, are not to be construed as limiting the present invention to their details.

Figure 1:
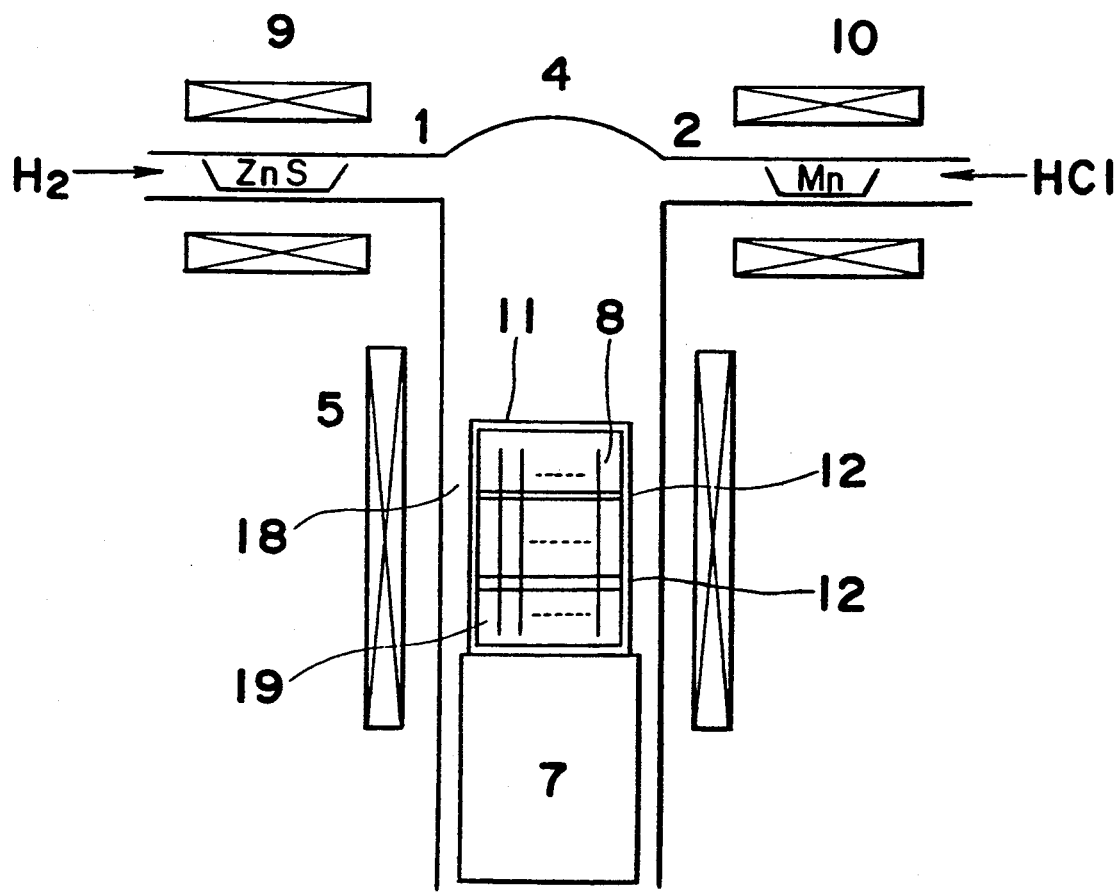

FIG. 1 schematically shows an apparatus employed in this Example. A source material (ZnS) was heated to 900° to 1,000° C. in a source furnace 9 and the resultant vapor was introduced into a reaction chamber 4 together with a carrier gas ($H_2$). The carrier gas might be He or Ar gas and the like. The Mn metal was heated to about 800° to 900° C. in a source furnace 10, to which HCl gas was introduced and reacted as follow;

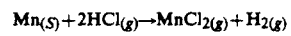

The obtained $MnCl_2$ gas was introduced into the reaction chamber 4. The introduction of the source material gas might be done by direct introduction of $ZnCl_2$ gas, $H_2S$ gas, $MnCl_2$ gas and the like.

The substrate 8 was a glass substrate (14cm × 17cm) on which a transparent electrode of ITO was formed about 1,500 angstroms and thereon a $SiO_2$ film and $Si_3N_4$ film were formed to total about 2,500 angstroms. The twenty substrates 8 were placed in a container box 11 having slits 12, of which an enlarged and schematical view is shown in FIG. 2. The container box 11 was the base having 18cm × 18cm and the height of 20.6 cm. It was prepared by placing a square pipe 14 having a 5 cm height on a lower box 13 having a 7.5 cm height through a spacer 16 of 4 mm, followed by placing an upper box 15 of 7.5 cm height thereon through a 2 mm spacer 17. The container box 11 had slit like apertures which are formed by means of the spacers 16 and 17. The second area 19 was formed inside the container box 11 and the first area 18 was formed outside it.

The container box 11 was placed on a substrate holder 7 and the substrates 8 therein were heated by a substrate furnace 5 to 450° to 600° C. The pressure inside the reaction tube 4 was kept about $10^{-2}$ torr. Deposition was conducted at a substrate temperature of 550° C. for 60 minutes.

The physical properties of the deposited ZnS:Mn film were evaluated and the results are shown in Table 1. For a comparison, the same deposition was conducted without the container 11 and the same evaluations were carried out. The results also are shown in Table 1.

TABLE 1

|  | Without container | With container |
| --- | --- | --- |
| Film thickness in Å | 8,000–7,500 | 7,600–7,400 |
| (Distribution %) | (±3.2) | (±1.3) |
| Growth rate in Å/min | 129 | 125 |
| Mn Concentration in film in atomic % | 0.32–0.96 | 0.37–0.43 |
| (Distribution %) | (±50) | (±7) |

The measurement was conducted on 6 points of the luminescent layer (10cm × 13cm). Growth rate was reduced about 5%, but film thickness and Mn concentration distribution were improved. Especially, Mn concentration distribution was significantly improved. Since an optimum Mn concentration of a ZnS:Mn device is generally within the range of 0.3 to 0.5 atomic %, the obtained film of the present invention was in the range and no difference in regard with the physical properties of the ZnS:Mn film was observed between the substrates.

Figure 4:
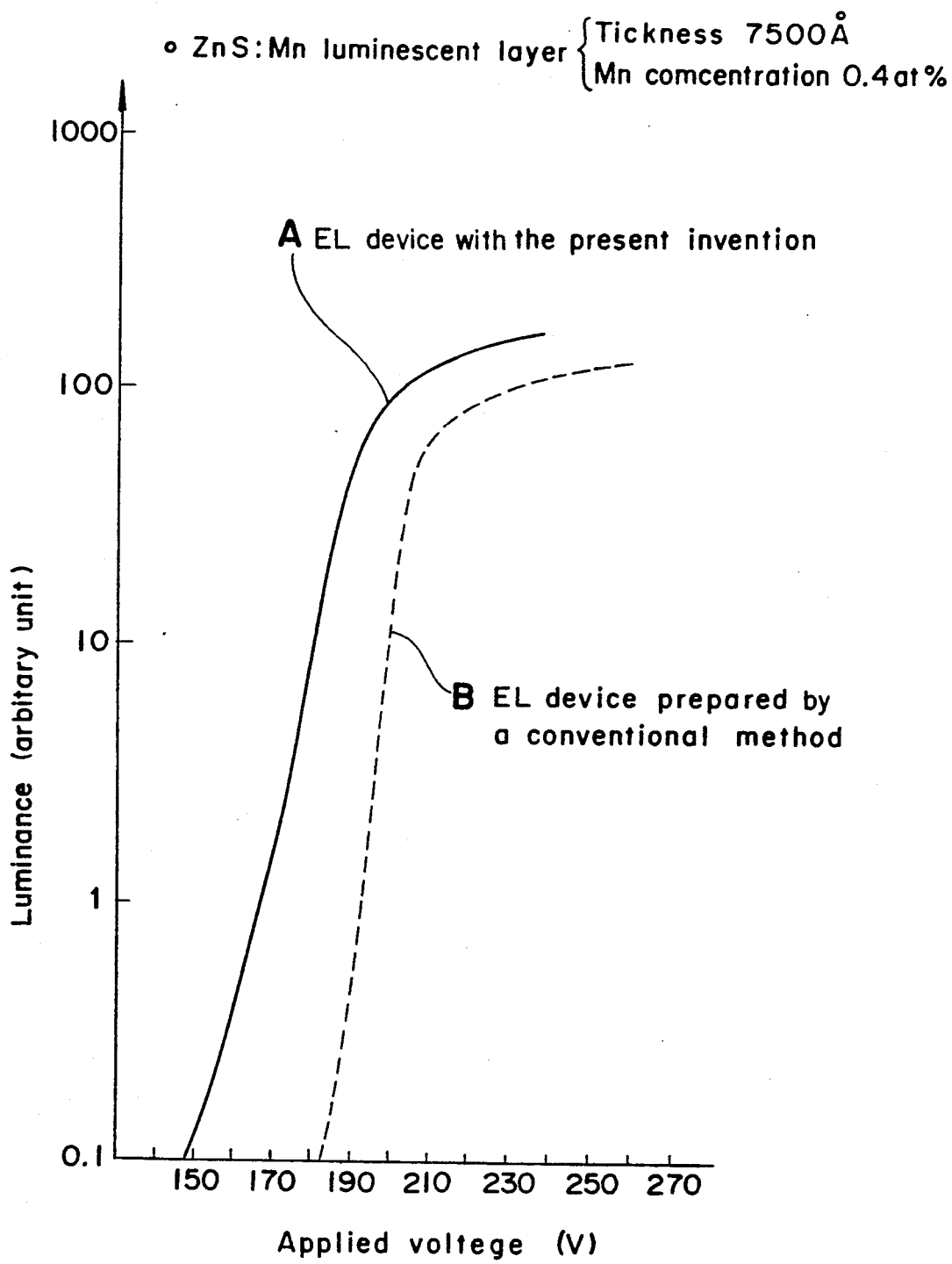
Figure 5A:
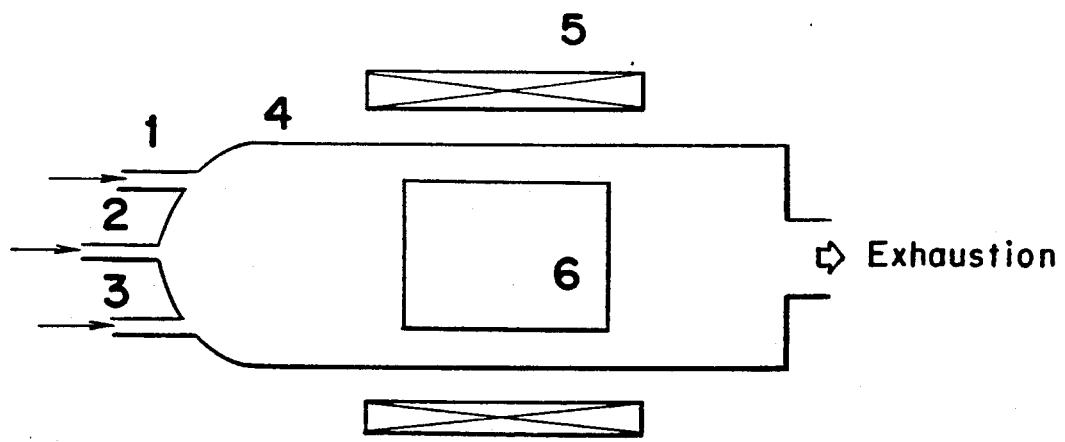
Figure 5:
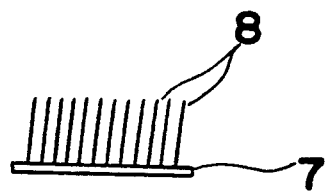

$Si_3N_4$ film and $Al_2O_3$ film (both total about 1,500 angstrom) and Al film (about 3,000 angstrom) were deposited on the ZnS:Mn film in this order to obtain an electroluminescent (EL) device. L-V (luminance-applied voltage) characteristics were determined with respect to the above obtained EL device and another conventional EL device which was prepared by the electron beam deposition, and FIG. 4 shows the results. Although a thickness of the luminescent film and an Mn concentration were common, the EL device of the present invention emitted at lower voltage and had a higher saturated luminescence (see line A of FIG. 4) than the conventional EL device (see line B of FIG. 4). The reason seems to show that the ZnS:Mn film prepared by the electron beam deposition method has a low efficient region from the substrate to 3,000 angstroms, but in the film of the present invention such a low efficient region is less than 1,000 angstroms according to the observation of SEM. This difference of the film structure provides a high luminance at low voltage and high saturated luminescence.

The above is explained about only one example, but the shape and size of the container 11 can be varied according to a shape and size of the substrate 8 and film forming conditions. In the above example, the apertures are slits, but can be holes. The slits may be present in upper and lower surface. FIG. 3 (a), (b) and (c) show schematical views of the above described apertures, which are, however, not limited thereto. The apertures may be determined such that the source material gas is constantly fed. In the above example, the ZnS:Mn films was produced, but the other film, such as ZnS:Tb, CaS:Eu and SrS:Ce can be produced by the above method.

According to the present invention, a thin film EL device having a large area can be produced on an industrial scale. Also, the process of the present invention has a high utilization degree of the source material gas and lowers producing cost.

What is claimed is:

1. A process for preparing a thin film electroluminescent device comprising forming a luminescent layer on a substrate by a reduced-pressure chemical vapor deposition method wherein a source material gas is introduced into a reaction chamber, and wherein said reaction chamber includes a screening means which screens said source material gas flow in said chamber to form a first area in which said gas is flowing and a second area in which said gas substantially does not flow, said screening means has apertures for connecting said first area and second area, and said substrate is placed in said second area, to which the source material is supplied by means of gas diffusion.

2. The process according to claim 1, wherein said source material and carrier gas comprise:

ZnS and $H_2$ (, He or Ar gas; and Mn and HCl gas.

3. The process according to claim 2, wherein said source material and carrier gas comprise:

ZnS and $H_2$; and Mn and HCl gas.

4. The process according to claim 1, wherein said screening means is a container box formed by placing a square shaped pipe on a lower box with at least a spacer therebetween, followed by placing an upper box on said square shaped pipe with a spacer therebetween.

5. The process according to claim 1, wherein said luminescent layer is ZnS:Mn, ZnS:Tb, CaS:Eu or SrS:Ce.

6. The process according to claim 1, wherein said source material gas comprises:

$ZnCl_2$ gas, $H_2S$ gas, and $MnCl_2$ gas.

* * * * *